(12) United States Patent
Smith et al.

(10) Patent No.: US 7,218,568 B2
(45) Date of Patent: May 15, 2007

(54) CIRCUIT AND METHOD FOR OPERATING A DELAY-LOCK LOOP IN A POWER SAVING MANNER

(75) Inventors: Scott Smith, Plano, TX (US); Tyler Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/482,268

(22) Filed: Jul. 7, 2006

(65) Prior Publication Data

US 2006/0250877 A1 Nov. 9, 2006

Related U.S. Application Data

(62) Division of application No. 11/077,641, filed on Mar. 11, 2005.

(51) Int. Cl.
*G11C 5/14* (2006.01)
(52) U.S. Cl. .................. 365/229; 365/194; 365/233
(58) Field of Classification Search ............ 365/229, 365/194, 233
See application file for complete search history.

(56) References Cited

U.S. PATENT DOCUMENTS

| | | | |
|---|---|---|---|
| 5,039,877 A | 8/1991 | Chern ................... 307/296.2 |
| 5,337,285 A | 8/1994 | Ware et al. ............... 365/227 |
| 5,524,096 A | 6/1996 | Roohparvar .............. 365/194 |
| 5,805,854 A | 9/1998 | Shigeeda .................. 395/401 |
| 5,910,930 A | 6/1999 | Dieffenderfer et al. ..... 368/156 |
| 6,069,506 A | 5/2000 | Miller, Jr. et al. .......... 327/156 |
| 6,240,942 B1 | 6/2001 | Ball ........................ 137/1 |
| 6,278,303 B1 | 8/2001 | Nakanishi et al. ......... 327/156 |
| 6,392,948 B1 | 5/2002 | Lee ........................ 365/222 |
| 6,438,060 B1 | 8/2002 | Li et al. ................... 365/227 |
| 6,462,998 B1 | 10/2002 | Proebsting ................ 365/205 |
| 6,473,360 B2 | 10/2002 | Ooishi ..................... 365/233 |
| 6,560,155 B1 | 5/2003 | Hush ....................... 365/222 |
| 6,574,200 B1 | 6/2003 | Tsumura ................... 370/311 |
| 6,618,319 B2 * | 9/2003 | Ooishi et al. ............. 365/233 |
| 6,665,219 B2 | 12/2003 | Li et al. ................... 365/194 |
| 6,678,206 B2 | 1/2004 | Chu et al. ................. 365/233 |
| 6,728,163 B2 | 4/2004 | Gomm et al. ............. 365/233 |
| 6,737,897 B2 | 5/2004 | Gomm et al. ............. 327/158 |
| 6,768,698 B2 | 7/2004 | Kono ....................... 365/233 |
| 6,809,990 B2 | 10/2004 | Thomann et al. .......... 365/233 |
| 6,819,626 B2 | 11/2004 | Okuda et al. .............. 365/233 |
| 6,836,437 B2 | 12/2004 | Li et al. ................... 365/194 |
| 6,842,396 B2 | 1/2005 | Kono ....................... 365/233 |
| 6,900,679 B2 | 5/2005 | Watarai .................... 327/158 |
| 6,930,524 B2 | 8/2005 | Drexler .................... 327/158 |
| 6,930,525 B2 | 8/2005 | Lin et al. .................. 327/161 |
| 6,930,949 B2 | 8/2005 | Schaefer ................... 365/227 |

* cited by examiner

*Primary Examiner*—Tuan T. Nguyen
(74) *Attorney, Agent, or Firm*—Dorsey & Whitney LLP

(57) ABSTRACT

A control circuit for a delay-lock loop having a delay line and a phase detector is used in a memory device. In a standby mode, the control circuit isolates a reference clock signal from the delay-lock loop to save power unless a clock signal generated by the loop is needed for a memory operation. However, the reference signal is periodically coupled to the delay line for a sufficient period to achieve a locked condition. As a result, the phase of the output signal from delay-lock loop can be quickly locked to the phase of the reference signal when a memory operation is to occur during a normal operating mode. When transitioning between the standby mode and the normal operating mode, the control circuit couples the reference clock signal to the delay line for at least a predetermined period of time.

31 Claims, 3 Drawing Sheets

CIRCUIT AND METHOD FOR OPERATING A DELAY-LOCK LOOP IN A POWER SAVING MANNER

CROSS-REFERENCE TO RELATED APPLICATION

This application is a divisional of pending U.S. patent application Ser. No. 11/077,641, filed Mar. 11, 2005.

TECHNICAL FIELD

The present invention is directed to memory and other electronic devices employing locked loops such as delay-lock loops ("DLL"), and more particularly, to a circuit and method for operating such loops in a manner that minimizes power consumption in such devices.

BACKGROUND OF THE INVENTION

Periodic digital signals are commonly used in a variety of electronic devices, such as memory devices. Probably the most common of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal.

As the speed of memory devices and other devices continue to increase, the "eye" or period in which a digital signal, such as a data signal, is valid becomes smaller and smaller, thus making the timing of a strobe signal or other clock signal used to capture the digital signal even more critical. In particular, as the size of the eye becomes smaller, the propagation delay of the strobe signal can be different from the propagation delay of the captured digital signal(s). As a result, the skew of the strobe signal relative to the digital signal can increase to the point where a transition of the strobe signal is no longer within the eye of the captured signal.

One technique that has been used to ensure the correct timing of a strobe signal relative to captured digital signals is to use a locked loop, such as a delay-lock loop ("DLL"), to generate the strobe signal in particular, a delay-lock loop allows the timing of the strobe signal to be adjusted to minimize the phase error between the strobe signal and the valid eye of the digital signal. A typical delay-lock loop uses a delay line (not shown) consisting of a large number of delay stages. A reference clock signal is applied to the delay line, and it propagates through the delay line to the final delay stage, which outputs a delayed clock signal. The phase of the delayed clock signal is compared to the phase of the reference clock signal to generate a phase error signal. The phase error signal is used to adjust the delay provided by the delay stages in the delay line until the phase of the delayed clock signal is equal to the phase of the reference clock signal.

Another problem associated with the high operating speed of memory and other devices is excessive power consumption, particularly for portable electronic devices like notebook or other portable computers. A significant amount of power consumption in portable computers is the result of power consumed by DRAM devices, which are normally used as system memory. It is therefore important to minimize the power consumed by DRAM devices so that such computers can be powered by batteries over an extended period. Excessive power consumption can also create problems even where DRAM devices are not powered by batteries. For example, the heat generated by excessive power consumption can damage the DRAM devices, and it can be difficult and/or expensive to maintain the temperature of electronic equipment containing the DRAM devices at an acceptably low value.

Power is consumed each time a digital circuit is switched to change the logic level of a digital signal. The rate at which power is consumed by DRAM and other memory devices therefore increases with both the operating speed of such devices and the number of circuits being switched. Thus, the demands for ever increasing operating speeds and memory capacity are inconsistent with the demands for ever decreasing memory power consumption.

Various circuits in DRAM devices consume power at various rates. A significant amount of power is consumed by locked loops, particularly delay-lock loops, which, as explained above are commonly used in DRAM devices. Delay-lock loops consume a great deal of power because the delay lines used in such loops often contain a large number of delay stages, all of which are switched as a reference clock signal propagates through the delay line. The higher reference clock signal frequencies need to operate the DRAM devices at higher speed causes these large number delay stages to be switched at a rapid rate, thereby consuming power at a rapid rate.

A number of techniques have been used to reduce power consumption in DRAM devices while allowing for increases in operating speeds and memory capacity. One approach has been to prevent digital circuits from switching when such circuits are not active since, as mentioned above, power is consumed each time a component in the digital circuit is switched from one state to another. While this approach can significantly reduce the power consumed by DRAM devices, there are circuits in DRAM devices that cannot be rendered inactive without compromising the speed and/or operability of the DRAM devices. Delay-lock loops, for example, often cannot be switched off because of the amount of time needed for the loops to achieve a locked condition after they have been powered down for a considerable period. For these reasons, the coupling of a reference clock signals to delay-lock loops have traditionally been terminated to reduce power consumption only when there is some assurance that it will not be necessary for the DRAM device to read or write data for a considerable period. For example, DRAM devices have been placed in a power-down state when the DRAM device switches to a self-refresh mode or when a computer system containing the DRAM devices switches to a low power standby mode. However, there are other times where the clock signals produced by delay-lock loops are not actually needed, and additional power savings could be achieved. Furthermore, removing the reference clock signals from delay-lock loops for long periods even during extended periods like self-refresh allows the delay of the delay lines used in the delay-lock loops to change considerably, thus requiring an undesirably long period for the delay-lock loop to again achieve a locked condition.

There is therefore a need for a method and system for allowing a reference clock signal to be removed from delay-lock loops to a greater extent, thereby further reducing power consumption, without sacrificing operating speed or performance resulting from the time needed for the loop to achieve a locked condition.

SUMMARY OF THE INVENTION

A circuit and method of operating a delay-lock loop includes a memory device in either a normal mode or a standby mode. In the normal mode, a reference clock signal is continuously coupled to a delay line used in the delay-lock loop. In the standby mode, the reference clock signal is generally isolated from the delay line so that the delay line does not consume power switching state responsive to the reference clock signal. However, the reference clock signal is periodically coupled to the delay line in the standby mode for an update period of sufficient duration to allow the delay-lock loop to achieve a locked condition. When entering the normal operating mode, the reference clock signal is coupled to the delay line for at least a predetermined period having a sufficient duration for the delay-lock loop to achieve a locked condition before the reference clock signal can again be isolated from the delay line. The normal operating mode is entered responsive to detecting a memory operation requiring a clock signal generated by the delay-lock loop, such as when a bank of memory cells in the memory device becomes active. When entering the standby mode, the reference signal is immediately isolated from the delay line if the loop is already locked. Otherwise, the reference signal remains coupled to the delay line for a sufficient period for the loop to become locked prior to being isolated from the delay line.

DETAILED DESCRIPTION OF THE INVENTION

Figure 1:
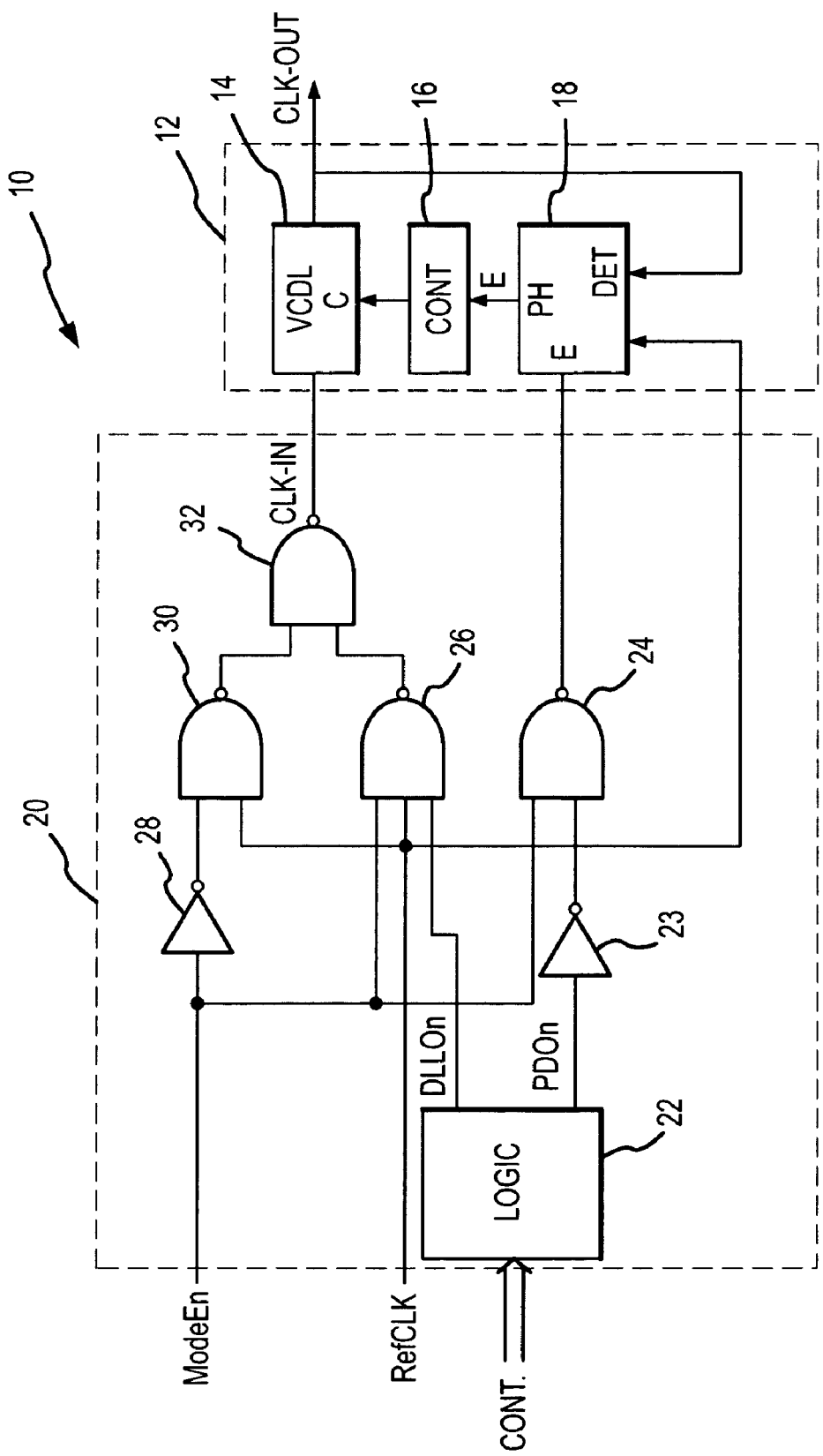
FIG. 1 is a block diagram of a control circuit for operating a delay-lock loop in a power saving mode according to one example of the invention.

A system 10 of controlling the operation of a delay-lock loop to minimize power consumption according to one example of the invention is shown in FIG. 1. The system 10 includes a delay-lock loop 12 having a voltage controlled delay line 14, which delays a CLK-IN signal applied to its input by a delay time determined by a control signal applied to its control "C" input. The control signal is supplied by a delay control circuit 16 based on an error signal. The error signal is generated by a phase detector 18, and it has a value corresponding to the difference between the phase of a CLK signal applied to one of its inputs and the phase of a CLK-OUT signal applied to the other of its inputs.

In operation, whenever the phase detector 18 is enabled by an active high signal applied to its E input, the phase detector 18 and delay control circuit 16 set the delay of the voltage controlled delay line 14 so that the phase of the CLK signal is equal to the phase of the CLK-OUT signal.

The operation of the delay-lock loop 12 is controlled by a loop control circuit 20. The loop control circuit 20 selectively enables the phase detector 18 with a phase detector On ("PDOn") signal generated by a logic circuit 22 and coupled through an inverter 23 and NAND gate 24. The logic circuit 22 receives several control signals CONT, the nature of which will be described in greater detail below. The logic circuit 22 also outputs a delay-lock loop On ("DLLOn") signal, which is applied to one input of a NAND gate 26. The NAND gate 26 also receives a Mode En signal and a reference clock RefCLK signal. The Mode En signal is also applied through an inverter 28 to one input of a NAND gate 30, which also receives the RefCLK signal, and to the other input of the NAND gate 24. The RefCLK signal coupled to the output of either of the NAND gates 26, 30 is applied to a NAND gate 32, which then outputs the CLK-IN signal to the DLL 12.

The Mode En signal is generated by a mode register (not shown in FIG. 1) that is typically used in DRAM devices. The mode register is programmed by a user to enable certain functions, including in this case, the ability to selectively power down the DLL 12. The Mode En signal enables either the NAND gates 24, 26 or the NAND gate 30, but not all three at the same time. When the Mode En signal is inactive low, the NAND gates 24, 26 are disabled so that they each output a high. The high at the output of the NAND gate 24 continuously enables the phase detector 18 regardless of the state of the PDOn signal. The high at the output of the NAND gate 26 enables the NAND gate 32. The low Mode En signal also enables the NAND gate 30 through the inverter 28 so that the RefCLK signal is coupled to the output of the enabled NAND gate 32. Thus, whenever, the Mode En signal is inactive low, the phase detector 18 is continuously enabled, and the RefClk signal is coupled to the voltage controlled delay line 14 regardless of the state of the DLLOn and PDOn signals from the logic circuit 22.

When the Mode En signal is active high, the NAND gate 30 is disabled through the inverter 28, thereby outputting a high to enable the NAND gate 32. The high Mode En signal also enables the NAND gates 24, 26. Under these circumstances the NAND gate 24 outputs a high to enable the phase detector 18 whenever the PDOn signal is active high. Alternatively, the NAND gate 24 outputs a low to disable the phase detector 18 whenever the PDOn signal is inactive low. In enabling the NAND gate 26, the high Mode En signal causes the NAND gate 26 to couple the RefCLK signal through the NAND gate 32 to generate the CLK-IN signal whenever the DLLOn signal is active high. Whenever the DLLOn signal is inactive low, the NAND gate 26 is disabled to terminate the CLK-IN signal.

In summary, when the Mode En signal is inactive low, the DLL 12 is continuously enabled. When the Mode En signal is active high, the DLLOn signal selectively causes the CLK-IN signal to be coupled to the voltage controlled delay line 14, and the PDOn signal selectively enables the phase detector 18. The DLLOn and PDOn signals are selectively switched to active and inactive states based upon a number of control signals CONT, which are indicative of the operation of a DRAM in which the system 10 is included.

The nature of the CONT signals that cause the logic to make the DLLOn and PDOn signals active or inactive will now be described with reference to the operating state of the DRAM in which the system 10 is included. It will be understood that these operating states are implemented by the control signals CONT that are applied to the logic circuit 22 in the loop control circuit 20. The DLLOn and PDOn signals are generated to couple the RefCLK signal to the delay line 14 and enable the phase detector 18, respectively, in a normal operating mode and in a standby mode as follows:

In the normal operating mode, the DLLOn and PDOn signals are continuously generated to couple the RefCLK signal to the delay line 14 and enable the phase detector 18.

When entering the normal operating mode, the DLLOn and PDOn signals are generated for at least a predetermined minimum period even if the standby mode is entered shortly thereafter. In one embodiment, this minimum period is 256 periods of a system clock signal. This prevents the DLL 12 from being turned on and off rapidly, which might allow the DLL 12 to operate in a spurious manner. The only exception is if the DLL 12 is already locked. If the DLL is locked, then the DLLOn and PDOn signals can immediately terminate as soon as the standby mode is entered.

In the standby mode, the DLLOn and PDOn signals are terminated to isolate the RefCLK signal from the delay line 14 and disable the phase detector 18 for a predetermined power-down period, which may be about 4,000 cycles of a system clock. After the power-down period, the DLLOn and PDOn signals are generated to coupled the RefCLK signal to the delay line 14 and enable the phase detector 18 for an update period of sufficient duration to allow the DLL 12 to achieve a locked condition. In one example of the DLL 12, the duration of the update period is 256 cycles of the system clock.

The normal operating mode is entered if a bank of memory cells becomes active.

The normal operating mode is also entered for a relatively long update period if the DLL 12 is reset, which ensures that the DLL 12 can achieve a locked condition. In one embodiment, the duration of the long update period is 1,000 cycles of the system clock. This long update period ensures that the DLL 12 has sufficient time to find a good lock point.

When exiting a power down period or when exiting a self-refresh period, the DLLOn and PDOn signals are generated for the long refresh period to couple the RefCLK signal to the delay line 14 and enable the phase detector 18 for the long update period.

Whenever an on die termination ("ODT") feature is enabled for a DRAM containing the DLL 12, the CLK-OUT signal is needed. However, the phase of the CLK-OUT signal need only be approximately correct. For this reason, the DLLOn signal is generated so that the RefCLK signal propagates through the delay line 14 to produce the CLK-OUT signal. The PDOn signal is not generated so the phase detector 18 remains disabled since there is no need to precisely adjust the phase of the CLK-OUT signal.

The DLLOn and PDOn signals may be generated whenever a load mode ("LDMD") command is applied to the DRAM containing the DLL 12 since the DLL 12 is reset by setting a bit in the mode register of the DRAM's command decoder.

Delay-lock loops according to various embodiments of the present invention can be used for a variety of purposes in electronic devices, such as memory devices. For example, with reference to FIG. 2, a synchronous dynamic random access memory ("SDRAM") 100 includes a command decoder 104 that controls the operation of the SDRAM 100 responsive to high-level command signals received on a control bus 106 and coupled through input receivers 108. These high level command signals, which are typically generated by a memory controller (not shown in FIG. 2), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 104 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The command decoder 104 also includes a mode register 105 that can be programmed by a user to control the operating modes and operating features of the SDRAM 100. The mode register 105 is programmed responsive to a load mode ("LDMD") command, which is registered responsive to a predetermined combination of the command signals applied to the command decoder 104 through the control bus 106. One of the operating features that can be programmed into the mode register is the previously described on die termination ("ODT") feature. As also previously described, the mode register 105 is programmed by setting a predetermined bit responsive to the load mode command to reset the DLL 12. It is for that reason the DLLOn and PDOn signals are generated whenever a load mode command is decoded, as described above.

The SDRAM 100 includes an address register 112 that receives row addresses and column addresses through an address bus 114. The address bus 114 is generally coupled through input receivers 110 and then applied to a memory controller (not shown in FIG. 2). A row address is generally first received by the address register 112 and applied to a row address multiplexer 118. The row address multiplexer 118 couples the row address to a number of components associated with either of two memory banks 120, 122 depending upon the state of a bank address bit forming part of the row address. Associated with each of the memory banks 120, 122 is a respective row address latch 126, which stores the row address, and a row decoder 128, which decodes the row address and applies corresponding signals to one of the arrays 120 or 122. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132. The refresh controller 132 is, in turn, controlled by the command decoder 104.

After the row address has been applied to the address register 112 and stored in one of the row address latches 126, a column address is applied to the address register 112. The address register 112 couples the column address to a column address latch 140. Depending on the operating mode of the SDRAM 100, the column address is either coupled through a burst counter 142 to a column address buffer 144, or to the burst counter 142 which applies a sequence of column addresses to the column address buffer 144 starting at the column address output by the address register 112. In either case, the column address buffer 144 applies a column address to a column decoder 148.

Figure 2:
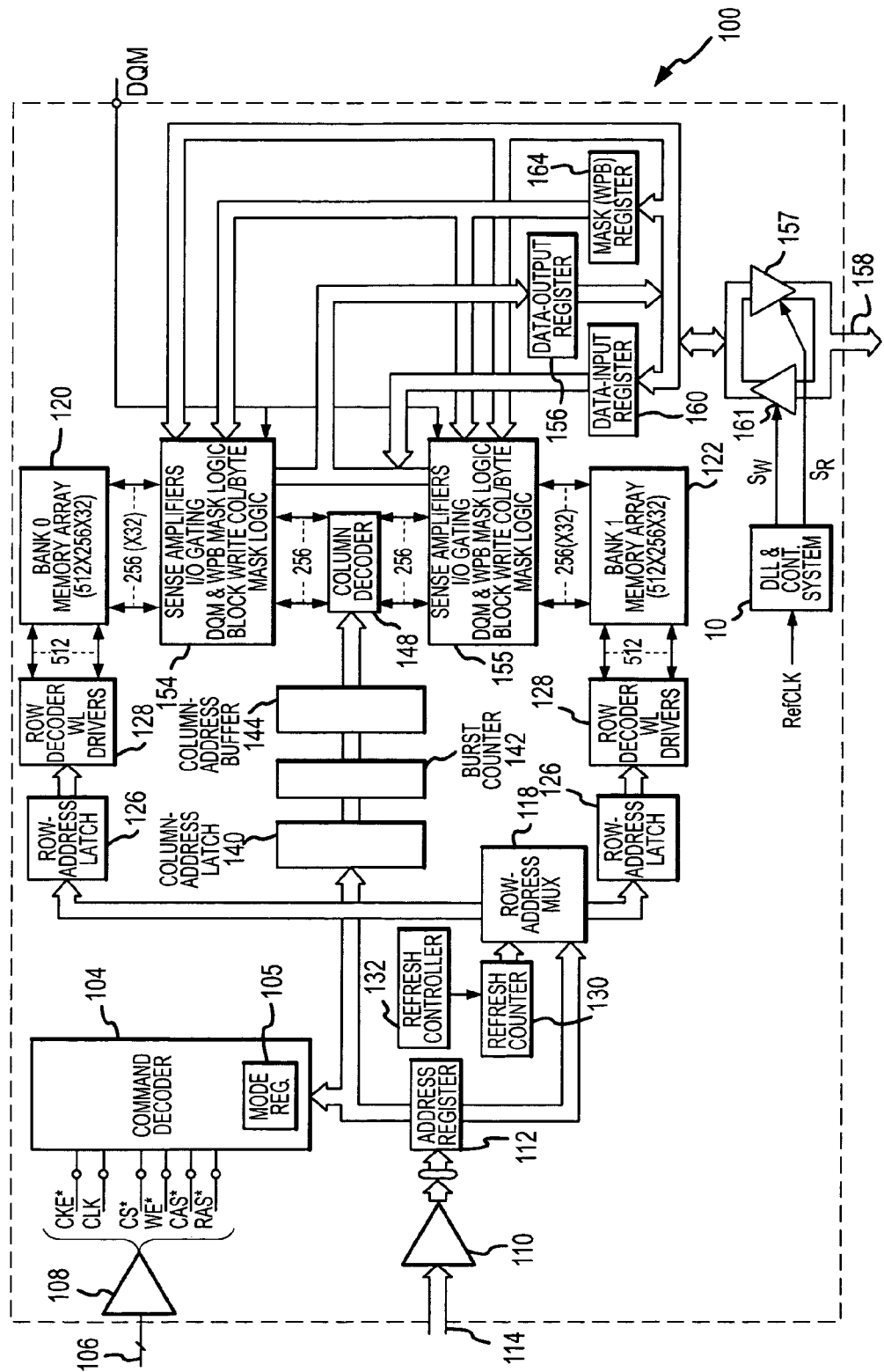
FIG. 2 is a block diagram of a memory device using the delay-lock loop and control circuit of FIG. 1 or some other example of the invention.

Data to be read from one of the arrays 120, 122 is coupled to the column circuitry 154, 155 for one of the arrays 120, 122, respectively. The data is then coupled through a data output register 156 and data output drivers 157 to a data bus 158. The data output drivers 157 apply the read data to the data bus 158 responsive to a read data strobe signal $S_R$ generated by the delay-lock loop 12 included in the delay-lock loop control system 10 or some other example of the invention. The SDRAM 100 shown in FIG. 2 is a double data rate ("DDR") SDRAM that inputs or outputs data twice each clock period. The delay-lock loop control system 10 receives the periodic RefCLK signal and generates the read data strobe $S_R$ with a phase that is substantially equal to the phase of the RefCLK signal. As a result, the read data are coupled to the data bus 158 substantially in phase with the RefCLK signal.

Data to be written to one of the arrays 120, 122 are coupled from the data bus 158 through data input receivers 161 to a data input register 160. The data input receivers 161 couple the write data from the data bus 158 responsive to a write data strobe signal $S_W$ generated by a second delay-lock loop 12 in the delay-lock loop control system 10 or by some other example of the invention. The delay-lock loop 12 in the control system 10 receives the periodic RefCLK signal and generates the write data strobe $S_W$ with a phase that is substantially the quadrature of the phase of the RefCLK signal. As a result, the write data are coupled into the SDRAM 100 from the data bus 158 at the center of a "data eye" corresponding to the phase of the RefCLK signal. The write data are coupled to the column circuitry 154, 155 where they are transferred to one of the arrays 120, 122, respectively. A mask register 164 responds to a data mask DM signal to selectively alter the flow of data into and out of the column circuitry 154, 155, such as by selectively masking data to be read from the arrays 120, 122.

Figure 3:
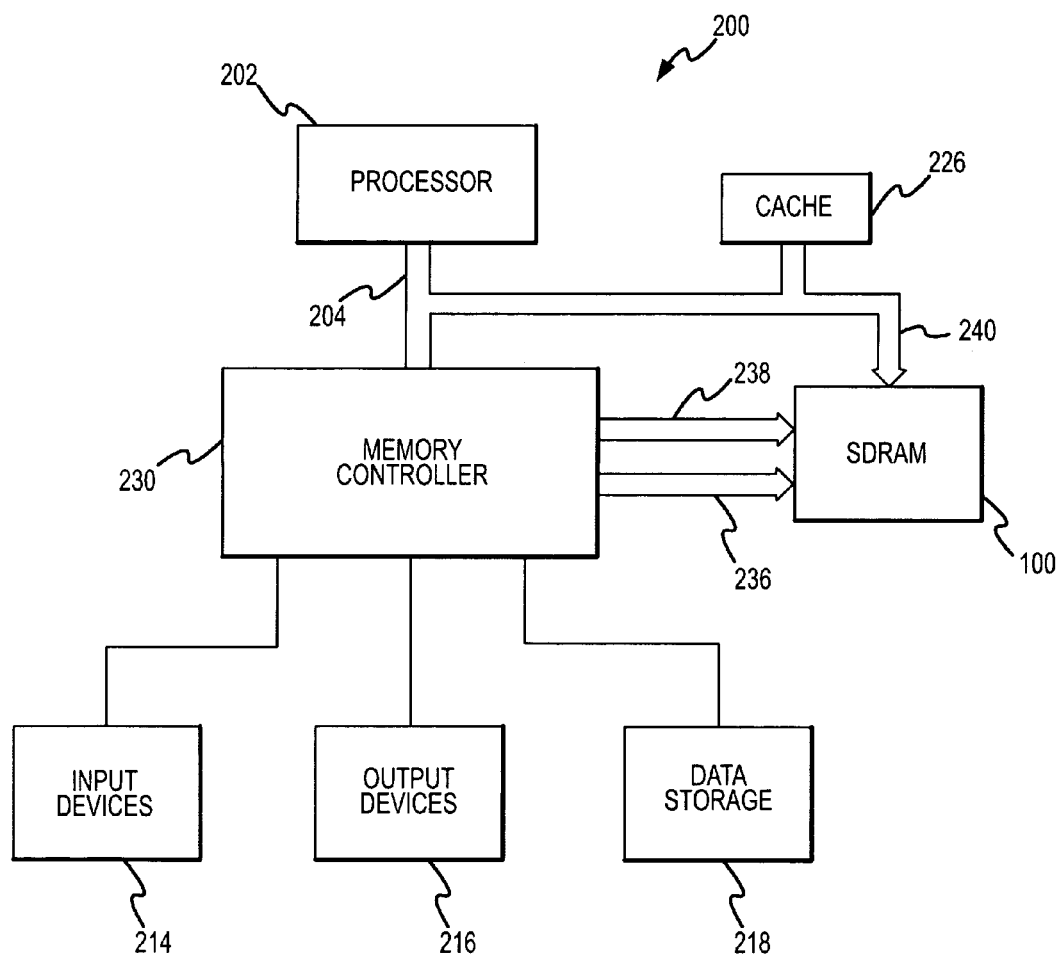
FIG. 3 is a block diagram of a computer system using the memory device of FIG. 2.

The SDRAM 100 shown in FIG. 2 can be used in various electronic systems. For example, it may be used in a processor-based system, such as a computer system 200 shown in FIG. 3. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the SDRAM 100 through a memory controller 230. The memory controller 230 normally includes a control bus 236 and an address bus 238 that are coupled to the SDRAM 100. A data bus 240 is coupled from the SDRAM 100 to the processor bus 204 either directly (as shown), through the memory controller 230, or by some other means.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A method of operating a delay-lock loop included in a memory device, the method comprising:
   in a normal operating mode of the memory device, continuously coupling a reference clock signal to a delay line used in the delay-lock loop; and
   in a standby mode of the memory device:
   entering a standby period in which the reference clock signal is isolated from the delay line; and
   while in the standby period, periodically coupling the reference clock signal to the delay line for an update period of sufficient duration to allow the delay-lock loop to achieve a locked condition, and then re-entering the standby period.

2. The method of claim 1, further comprising, when the memory device enters the normal operating mode, coupling the reference clock signal to the delay line for at least a predetermined period.

3. The method of claim 1, further comprising:
   detecting when a bank of memory cells in the memory device becomes active when the memory device is in the standby mode; and
   coupling the reference clock signal to the delay line used in the delay-lock loop responsive to detecting that the bank of memory cells has become active.

4. The method of claim 1, further comprising:
   determining if the delay-lock loop is in a locked condition when entering the standby mode;
   if the determination is made that the delay-lock loop is in a locked condition when entering the standby mode, immediately isolating the reference clock signal from the delay line; and
   if the determination is made that the delay-lock loop is not in a locked condition when entering the standby mode, continuing to couple the reference clock signal to the delay line for a predetermined period before isolating the reference clock signal from the delay line.

5. The method of claim 1, further comprising:
   determining if the delay-lock loop is being reset when the memory device is in the standby mode; and
   in response to determining that the delay-lock loop is being reset, coupling the reference clock signal to the delay line for a reset period before isolating the reference clock signal from the delay line.

6. The method of claim 5 wherein the reset period is substantially longer than the update period.

7. The method of claim 1, further comprising:
   determining if memory device is transitioning from the standby mode to the normal operating mode; and
   in response to determining that the memory device is transitioning from the standby mode to the normal operating mode, coupling the reference clock signal to the delay line for a period that is substantially longer than the update period.

8. The method of claim 1 wherein the memory device is operable in a refresh mode in which refresh signals are generated internally in the memory device, and wherein the method further comprises:
   determining if memory device is transitioning from the refresh mode in which refresh signals are generated internally in the memory device, and
   in response to determining that the memory device is transitioning out of the refresh mode in which refresh signals are generated internally in the memory device, coupling the reference clock signal to the delay line for a period that is substantially longer than the update period.

9. The method of claim 8 wherein the refresh mode in which refresh signals are generated internally in the memory device comprises a self-refresh mode.

10. The method of claim 1 wherein the delay-lock loop further comprise a phase detector having first and second input terminals receiving the reference clock signal and an output signal from the delay line, the phase detector being operable to generate an output signal that controls the delay of the delay line, the method further comprising selectively enabling and disabling the phase detector when the memory device is operating in the standby mode.

11. The method of claim 10 wherein the memory device is operable in an on die termination mode, and wherein the method further comprises disabling the phase detector in the on die termination mode while coupling the reference clock signal to the delay line when the memory device is operating in the standby mode.

12. The method of claim 1 wherein the memory device comprises a mode register that is programmable responsive to a load mode command, and wherein the method further comprises:
- detecting the load mode command, and
- when in the standby mode, coupling the reference clock signal to the delay line used in the delay-lock loop responsive to detecting the load mode command.

13. A method of operating a delay-lock loop included in a memory device, the method comprising:
- in a standby mode of the memory device, isolating the reference clock signal from a delay line used in the delay-lock loop; and
- in a normal operating mode of the memory device, continuously coupling the reference clock signal to the delay line for at least a predetermined period regardless of whether or not the memory device remains in the normal operating mode.

14. The method of claim 13, further comprising:
- detecting when a bank of memory cells in the memory device becomes active when the memory device is in the standby mode;
- coupling the reference clock signal to the delay line used in the delay-lock loop responsive to detecting that the bank of memory cells has become active.

15. The method of claim 13, further comprising:
- determining if the delay-lock loop is in a locked condition when entering the standby mode;
- if the determination is made that the delay-lock loop is in a locked condition when entering the standby mode, immediately isolating the reference clock signal from the delay line; and
- if the determination is made that the delay-lock loop is not in a locked condition when entering the standby mode, continuing to couple the reference clock signal to the delay line for a predetermined period before isolating the reference clock signal from the delay line.

16. The method of claim 13, further comprising:
- determining if the delay-lock loop is being reset when the memory device is in the standby mode; and
- in response to determining that the delay-lock loop is being reset, coupling the reference clock signal to the delay line for a reset period before isolating the reference clock signal from the delay line, the reset period being longer than the predetermined period during which the reference clock signal is coupled to the delay line.

17. The method of claim 13, further comprising:
- determining if memory device is transitioning from the standby mode to the normal operating mode; and
- in response to determining that the memory device is transitioning from the standby mode to the normal operating mode, coupling the reference clock signal to the delay line for a period that is substantially longer than the predetermined period during which the reference clock signal is coupled to the delay line.

18. The method of claim 13 wherein the memory device is operable in a refresh mode in which refresh signals are generated internally in the memory device, and wherein the method further comprises:
- determining if memory device is transitioning from the refresh mode in which refresh signals are generated internally in the memory device, and
- in response to determining that the memory device is transitioning out of the refresh mode in which refresh signals are generated internally in the memory device, coupling the reference clock signal to the delay line for a period that is substantially longer than the predetermined period during which the reference clock signal is coupled to the delay line.

19. The method of claim 18 wherein the refresh mode in which refresh signals are generated internally in the memory device comprises a self-refresh mode.

20. The method of claim 13 wherein the delay-lock loop further comprise a phase detector having first and second input terminals receiving the reference clock signal and an output signal from the delay line, the phase detector being operable to generate an output signal that controls the delay of the delay line, the method further comprising selectively enabling and disabling the phase detector when the memory device is operating in the standby mode.

21. The method of claim 20 wherein the memory device is operable in an on die termination mode, and wherein the method further comprises disabling the phase detector in the on die termination mode while coupling the reference clock signal to the delay line when the memory device is operating in the standby mode.

22. The method of claim 13 wherein the memory device comprises a mode register that is programmable responsive to a load mode command, and wherein the method further comprises:
- detecting the load mode command, and
- when in the standby mode, coupling the reference clock signal to the delay line used in the delay-lock loop for at least the predetermined period responsive to detecting the load mode command.

23. In a memory device having a delay-lock loop including a delay line, a method of transitioning the memory device from a normal operating mode in which a reference clock signal is coupled to the delay line to a standby mode in which the reference clock signal is isolated from the delay line, the method comprising:
- determining if the delay-lock loop is in a locked condition when entering the standby mode;
- if the determination is made that the delay-lock loop is in a locked condition when entering the standby mode, immediately isolating the reference clock signal from the delay line; and
- if the determination is made that the delay-lock loop is not in a locked condition when entering the standby mode, continuing to couple the reference clock signal to the delay line for a predetermined period before isolating the reference clock signal from the delay line.

24. The method of claim 23, further comprising:
- detecting when a bank of memory cells in the memory device becomes active when the memory device is in the standby mode; and
- coupling the reference clock signal to the delay line used in the delay-lock loop responsive to detecting that the bank of memory cells has become active.

25. The method of claim 23, further comprising:
- determining if the delay-lock loop is being reset when the memory device is in the standby mode; and
- in response to determining that the delay-lock loop is being reset, coupling the reference clock signal to the delay line for a reset period before isolating the reference clock signal from the delay line.

26. The method of claim 23, further comprising:
  determining if memory device is transitioning from the standby mode to the normal operating mode; and
  in response to determining that the memory device is transitioning from the standby mode to the normal operating mode, coupling the reference clock signal to the delay line for at least a predetermined period.

27. The method of claim 23 wherein the standby mode comprises a refresh mode in which refresh signals are generated internally in the memory device, and wherein the method further comprises:
  determining if memory device is transitioning from a predetermined refresh mode; and
  in response to determining that the memory device is transitioning out of the predetermined refresh mode, coupling the reference clock signal to the delay line for at least a predetermined period.

28. The method of claim 23 wherein the predetermined refresh mode comprises a self-refresh mode.

29. The method of claim 23 wherein the delay-lock loop further comprise a phase detector having first and second input terminals receiving the reference clock signal and an output signal from the delay line, the phase detector being operable to generate an output signal that controls the delay of the delay line, the method further comprising selectively enabling and disabling the phase detector when the memory device is operating in the standby mode.

30. The method of claim 29 wherein the memory device is operable in an on die termination mode, and wherein the method further comprises disabling the phase detector in the on die termination mode while coupling the reference clock signal to the delay line when the memory device is operating in the standby mode.

31. The method of claim 23 wherein the memory device comprises a mode register that is programmable responsive to a load mode command, and wherein the method further comprises:
  detecting the load mode command, and
  when in the standby mode, coupling the reference clock signal to the delay line used in the delay-lock loop responsive to detecting the load mode command.

* * * * *